United States Patent [19]
Kang

[11] Patent Number: 5,387,961
[45] Date of Patent: Feb. 7, 1995

[54] ILLUMINATION SYSTEM FOR PROJECTION EXPOSING APPARATUS

[75] Inventor: Ho-young Kang, Suwon, Rep. of Korea

[73] Assignee: Samsung Electronics Co., Ltd., Suwon, Rep. of Korea

[21] Appl. No.: 155,002

[22] Filed: Nov. 22, 1993

[30] Foreign Application Priority Data

Nov. 20, 1992 [KR] Rep. of Korea ............... 92-22906

[51] Int. Cl.⁶ .................. G03B 27/72; G03B 27/54
[52] U.S. Cl. ........................ 355/71; 355/53; 355/67
[58] Field of Search ............... 355/53, 67, 71; 362/268

[56] References Cited

U.S. PATENT DOCUMENTS

| | | | |
|---|---|---|---|
| Re. 34,634 | 6/1994 | Konno et al. | 362/268 |
| 4,497,015 | 1/1985 | Konno et al. | 362/268 |
| 4,619,508 | 10/1986 | Shibuya et al. | 353/122 |
| 4,789,222 | 12/1988 | Ota et al. | 350/167 |
| 4,939,630 | 7/1990 | Kikuchi et al. | 362/268 |
| 5,160,962 | 11/1992 | Miura et al. | 355/53 |
| 5,237,367 | 8/1993 | Kudo | 355/67 |
| 5,245,384 | 9/1993 | Mori | 355/67 |
| 5,296,892 | 3/1994 | Mori | 355/67 |
| 5,300,971 | 4/1994 | Kudo | 355/67 |
| 5,309,198 | 5/1994 | Nakagawa | 355/67 |
| 5,311,249 | 5/1994 | Kamon et al. | 355/71 |

*Primary Examiner*—Richard A. Wintercorn
*Attorney, Agent, or Firm*—Charles R. Donohoe; Robert A. Westerlund, Jr.; Stephen R. Whitt

[57] ABSTRACT

An illumination system for a projection exposing apparatus having an improved fly's eyes lens is disclosed in which an individual lens of a fly's eyes lens includes a pattern portion having a plurality of annuluses with the same center but different diameters, and an etch portion disposed alternately with the pattern portion. The etch portion is formed to have a phase difference of 180 degrees with respect to the pattern portion.

3 Claims, 2 Drawing Sheets

ILLUMINATION SYSTEM FOR PROJECTION EXPOSING APPARATUS

BACKGROUND OF THE INVENTION

The present invention relates to a projection exposing apparatus used in manufacturing semiconductor devices and, more particularly, to an illumination system for a projection exposing apparatus having an improved fly's eyes lens.

FIG. 1 illustrates schematically a conventional illumination system for a projection exposing apparatus that is used in manufacturing semiconductor devices. The system includes a reflection mirror 2 placed in front of a light source 1, a fly's eyes lens 3 and a condenser lens sequentially located to the rear of light source 1. The fly's eyes lens 3 contains many small lenses each of which has a diameter smaller than several millimeters.

In such an illumination system, the light from light source 1, incident to fly's eyes lens 3, varies widely in intensity according to location. After the light passes through fly's eyes lens 3, more uniform illumination is achieved on an image-forming surface by the plurality of fly's eye lenses.

Recent developments in exposure technology demand finer resolution, therefore, the exposure area must become smaller or the number of lenses must be reduced. In practice, this is difficult to accomplish and still obtain uniform illumination. Phase shift techniques or annular illumination techniques, which have been recently developed and employed in the field in order to perform a high resolution tilted illumination, block the central light passing the fly's eyes lens using a filter and only 20–50% of the light is used. This deteriorates the illumination uniformity. Further, even if the number of lenses can be increased by reducing the size of individual lenses, because the fly's eyes lens consists of 50–100 individual lenses, the overall manufacturing cost is expensive and manufacturability of the required small lenses is too difficult to be practical.

An alternative to the conventional fly's eyes lens uses a zone plate, which is a lens that diffracts light. As shown in FIGS. 2A and 2B, the zone plate forms a concentric circular pattern so that light is alternately transmitted or blocked. This pattern can reduce the size of individual lenses and form a number of lenses, to thereby improve the illumination uniformity. However, since light is blocked in one-half of the lenses, the overall light transmission efficiency decreases to below 50%. Thus, the zone plate has not been widely employed despite its simple manufacturability.

SUMMARY OF THE INVENTION

It is an object of the present invention to provide an illumination system for a projection exposing apparatus having an improved fly's eyes lens in which the size of individual lenses is greatly reduced and the number of lenses increased to acquire uniform illumination and enhance light transmission efficiency.

To accomplish the object, there is provided an illumination system for a projection exposing apparatus of the present invention having a light source and a fly's eyes lens in which a multitude of individual lenses are closely disposed so that the light from the light source is received to carry out uniform illumination. The individual lenses of the fly's eyes lens comprise a pattern portion having a plurality of annuluses with the same center but different diameters, and an etch portion disposed alternately with the pattern portion, so as to transmit incident light directly or by diffraction. In the present invention, the etch portion is formed to have the phase difference of 180 degrees with respect to the pattern portion.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE PREFERRED EMBODIMENT OF THE INVENTION

The illumination system for a projection exposing apparatus of the present invention uses the same configuration as the conventional system, and includes a light source 1, a reflection mirror 2 placed in front of light source 1 for reflecting and condensing the light emitted from the light source, a fly's eyes lens 3 and a condenser lens 4 sequentially located along a light traveling path from the light source 1.

Figure 3A:
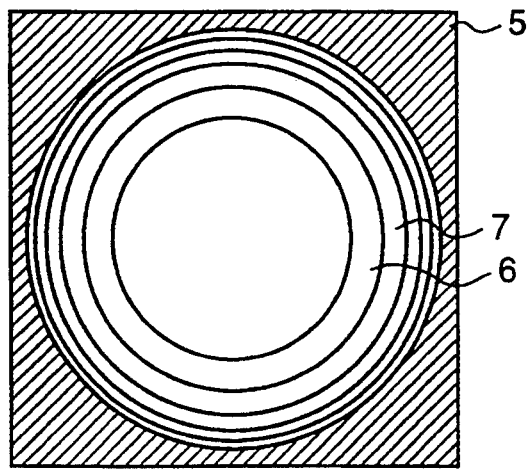
FIG. 3A is a front view of an individual lens of an improved fly's eyes lens of the present invention corresponding to that of FIGS. 2A and 2B.
Figure 3B:
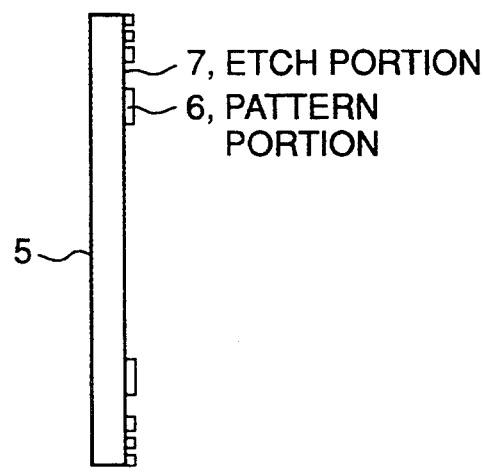
FIG. 3B is a cross-sectional view of the individual lens illustrated in FIG. 3A.

The fly's eyes lens 3 contains a multitude of closely disposed small lenses. As shown in FIGS. 3A and 3B, an individual lens 5 of the fly's eyes lens includes a pattern portion 6 having multiple annuluses with the same center but different diameters, and an etch portion 7 which alternates with each pattern portion 6. Etch portion 7 has a phase difference of 180 degrees from that of pattern portion 6. Given a wavelength of $\lambda$ and refraction of index n, in order to create the phase difference of 180 degrees, the etching depth of etch portion 7 is preferably $\lambda/2(n\ 1)$. Thus, in-phase light is transmitted, and the out-of-phase light is inverted by 180 degrees when the light passes through individual lenses 5.

Figure 1:
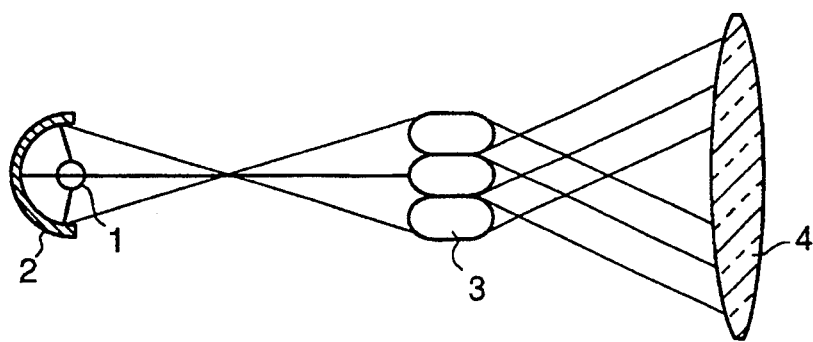
FIG. 1 illustrates schematically an illumination system for a projection exposing apparatus which may be employed to both the prior art and the present invention.
Figure 2A:
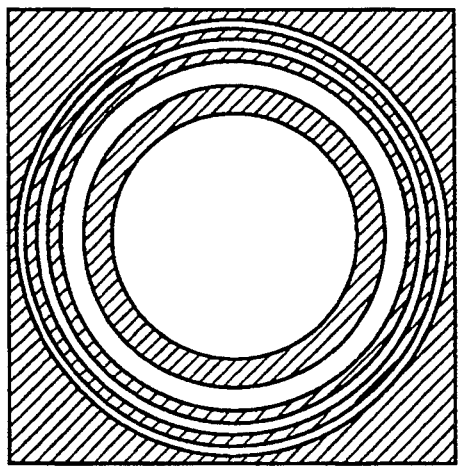
FIG. 2A is a front view of an individual lens of a zone plate using the diffraction of light.
Figure 2B:
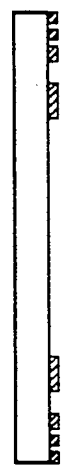
FIG. 2B is a cross-sectional view of the individual lens illustrated in FIG. 2A.

Individual lens 5 may be manufactured by a well-known photolithography technique. If the individual lens is arranged in its tightest pattern, the fly's eyes lens according to in the present invention is formed. Specifically, using a pattern forming device, an annular pattern concentric with a central circle is formed on a substrate by applying a photoresist thereon. Thereafter, this substrate is etched to a depth such that the phase difference of 180 degrees is created with respect to the pattern portion, and then the photoresist is removed. This is substantially the same pattern as that of the conventional zone plate shown in FIGS. 2A and 2B.

However, the difference of the flys eye lens according to the present invention is that the etch portion is etched to a depth such that the phase difference of 180 degrees is created with respect to the pattern portion, so that the annular light blocking portion of the zone plate is changed into a light transmitting portion.

Figure 4:
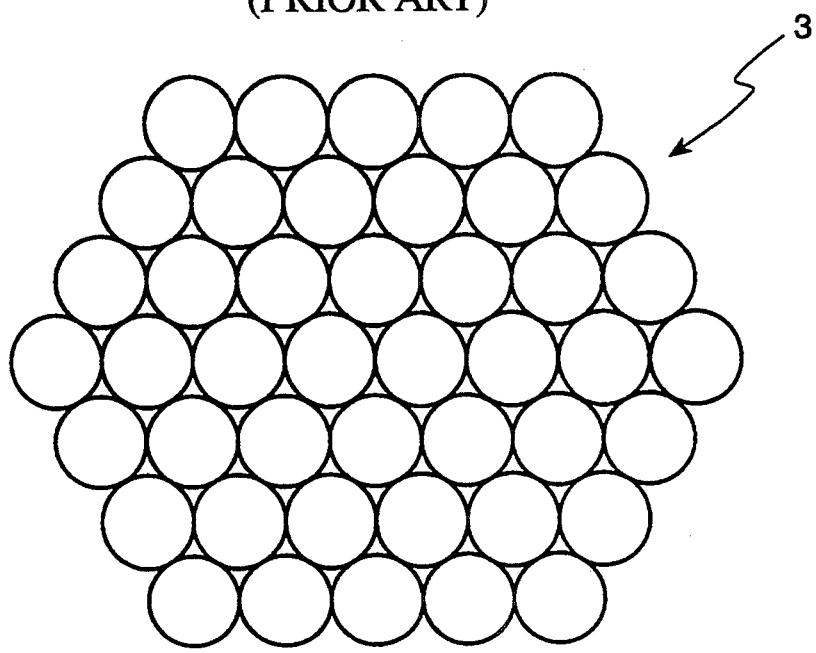
FIG. 4 shows a conventional fly's eyes lens.
Figure 5:
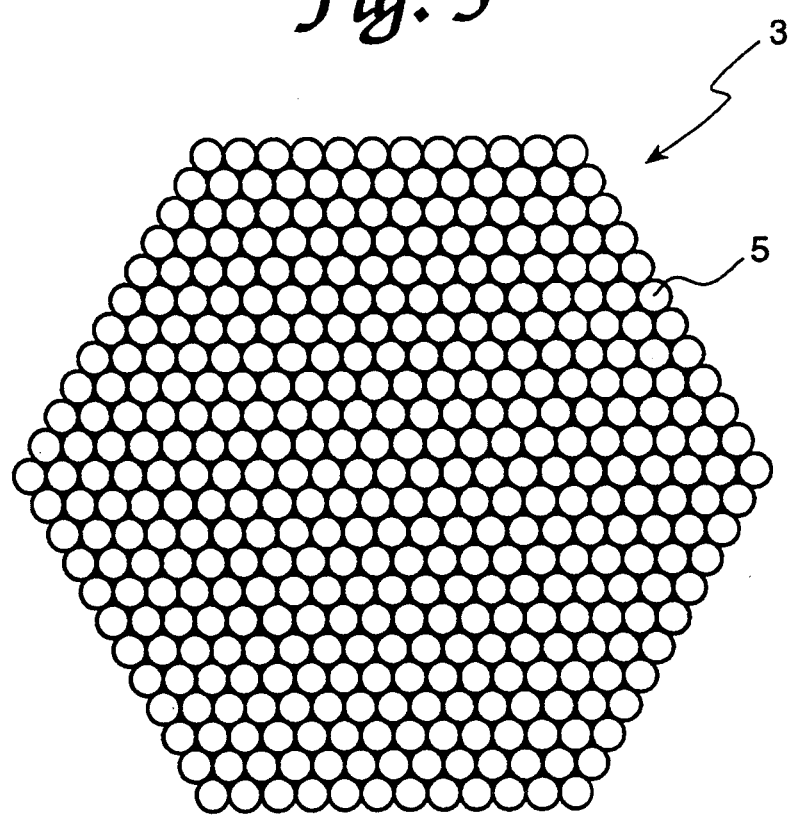
FIG. 5 shows the improved fly's eyes lens adopted in the present invention.

FIG. 5 illustrates the close arrangement of individual lenses 5 formed in the above manner. When the fly's eyes lens according to the present invention is compared with the conventional fly's eyes lens shown in FIG. 4, the individual lenses of the fly's eyes lens according to the present invention are reduced to less than one fourth in diameter and the total number of the individual lenses are increased more than sixteen times. As a result, the uniformity of illumination is improved by a factor of more than four. For instance, in the conventional fly's eyes lens, if the focal length is 20 mm, the overall diameter is 50 mm and the diameter of the individual lenses is 5 mm, the arrangeable number of the individual lenses was limited at 100. However, in the fly's eyes lens of the present invention, if the focal length is 20 mm, wavelength is 0.365 $\mu$m, the diameter of the central circle is 85 $\mu$m and 50 concentric circles are formed, since the diameter of the outermost circle is 1,204 $\mu$m, about 1,600 individual lenses can be arranged.

While the invention has been described in connection with what is presently considered to be the most practical and preferred embodiments, the invention is not limited to the disclosed embodiment but, on the contrary, is intended to cover various modifications and equivalents included within the spirit and scope of the following claims.

What is claimed is:

1. An illumination system for a projection exposing apparatus comprising:
   a light source; and
   a fly's eyes lens including a plurality of adjacently disposed individual lenses, each said individual lenses having alternatively disposed pattern portions and etch portions concentric with a center of said individual lens, said pattern portions and said etch portions capable of transmitting incident light therethrough.

2. An illumination system for a projection exposing apparatus according to claim 1, wherein said etch portions have a phase difference of 180 degrees with respect to said pattern portions.

3. An illumination system for a projection exposing apparatus according to claim 2, wherein said incident light has a wavelength of $\lambda$, the refractive index of each individual lens is n, and an etching depth of said etch portion is $\lambda/2(n-1)$.

* * * * *